United States Patent [19]
Ohtani et al.

[11] Patent Number: 6,007,629
[45] Date of Patent: *Dec. 28, 1999

[54] SUBSTRATE PROCESSING APPARATUS

[75] Inventors: Masami Ohtani; Tadashi Sasaki, both of Kyoto, Japan

[73] Assignee: Dainippon Screen Mfg. Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/770,555

[22] Filed: Dec. 23, 1996

[30] Foreign Application Priority Data

Dec. 28, 1995 [JP] Japan ................................. 7-343649

[51] Int. Cl.$^6$ ...................................................... B05C 11/10
[52] U.S. Cl. ............................ 118/600; 118/665; 118/667
[58] Field of Search ............................. 118/52, 600, 320, 118/319, 666, 667, 665; 165/58, 108, DIG. 347, 154; 222/146.6, 183; 137/340, 375; 73/290 R

[56] References Cited

U.S. PATENT DOCUMENTS

| | | | |
|---|---|---|---|
| 4,413,255 | 11/1983 | Cohen et al. | 137/558 |
| 4,886,012 | 12/1989 | Ikeno et al. | 118/52 |
| 4,932,553 | 6/1990 | Kawata et al. | 118/52 |
| 5,035,200 | 7/1991 | Moriyama et al. | 118/693 |
| 5,374,312 | 12/1994 | Hasebe et al. | 118/52 |

FOREIGN PATENT DOCUMENTS

| | | |
|---|---|---|
| 73023658 | 6/1973 | Japan . |
| 58021833 | 2/1983 | Japan . |
| 04142033 | 5/1992 | Japan . |

*Primary Examiner*—David A. Simmons
*Assistant Examiner*—Calvin Padgett
*Attorney, Agent, or Firm*—Ostrolenk, Faber, Gerb & Soffen, LLP

[57] ABSTRACT

A chemical supplied onto a substrate is contained in a chemical container. A chemical cooling unit keeps the chemical contained in the chemical container cooled to a proper temperature for storage. A chemical pressure-transferring portion causes the chemical to flow from the chemical container into a chemical introducing pipe. A chemical temperature controller portion changes the temperature of the chemical guided by the chemical introducing pipe to a proper temperature for application on a substrate. The chemical brought to the proper application temperature is guided to a chemical dispensing unit, which dispenses the chemical onto a substrate.

27 Claims, 4 Drawing Sheets

SUBSTRATE PROCESSING APPARATUS

BACKGROUND OF THE INVENTION

1. Field of the Invention

The present invention relates to substrate processing apparatuses, and more particularly to a substrate processing apparatus for supplying prescribed chemicals onto substrates (e.g., semiconductor wafers, glass substrates used as bases of liquid crystal displays, glass substrates for photomasks, substrates for optical disks, etc.).

2. Description of Related Art

As is well known, it is necessary in the process of manufacturing semiconductor apparatuses, liquid crystal displays, etc. to supply various chemicals (SOG, photoresist, developer, etchant, etc.) onto surfaces of such substrates as mentioned above. The aforementioned substrate processing apparatus is used for the supply of chemicals.

The substrate processing apparatus supplies chemicals onto the substrates using the same basic principles regardless of the type of the chemicals being used. That is to say, it drops a prescribed chemical in the vicinity of the center of rotation of a substrate rotating in the horizontal direction and causes it to spread all over the surface of the substrate by centrifugal force.

As an example of a substrate processing apparatus, an apparatus for supplying SOG (Spin On Glass, the apparatus is referred to as an SOG coater, hereinafter) will be described. FIG. 1 is a perspective view showing the entire structure of a conventional SOG coater. In FIG. 1, the SOG coater includes a wafer chuck 41 which holds by vacuum suction, for example a substrate (not shown) for rotatable movement about a rotation axis A (shown by the single dot line), a chemical dispensing nozzle 42 for dispensing a chemical onto the substrate surface, a nozzle arm 43 rotating around the rotation axis B (shown by the double-dot line) for placing the chemical dispense nozzle 42 in a prescribed position above the substrate, and a chemical introducing pipe 44 for introducing a chemical supplied from a chemical container (not shown) to the chemical dispense nozzle 42. The SOG coater also includes other structural elements, but they are not described and not shown in the drawing to clarify the invention.

In the aforementioned structure, a substrate is placed on the wafer chuck 41 by a transfer unit, not shown. The nozzle arm 43 places the chemical dispense nozzle 42 in a prescribed position above the substrate. Then the chemical introduced from an external chemical container is supplied to the chemical dispense nozzle 42 through the chemical introducing pipe 44. The chemical dispense nozzle 42 dispenses the chemical onto the substrate surface.

The SOG which is supplied onto the substrate surface by the SOG coater a chemical containing a silicon compound dissolved in a highly volatile organic solvent, such as alcohol, ester, ketone, or the like, which is mainly used for the purpose of planarizing interlayer insulating film formed on the substrate. SOG has the property of easily crystallizing at room temperature (about 23° C.). Therefore, storing it at room temperature reduces its lifetime. Accordingly, when not used, the SOG is held in a chemical container and stored in a refrigerator (at a temperature of about 5° C.) installed in a position separated from the substrate processing apparatus.

When using SOG, it is necessary to take out the chemical container of SOG from the refrigerator, expose it to room temperature until it attains the proper temperature for use (room temperature or thereabouts), and then place it in a prescribed position in the SOG coater. Since the SOG takes a long time to attain room temperature, substrate processing also requires a long time, thereby reducing the operating efficiency of the SOG coater. Furthermore, since the chemical container includes only the required amount of SOG for substrate processing, an operator must exchange the chemical container for every single substrate processing. This will increase the operator's work load, and consequently lowers the operator's work efficiency. Furthermore, when some SOG is left after substrate processing is finished, it must be discarded because it can not be used in the next substrate processing.

The aforementioned problems can be encountered not only with an SOG coater, but also with substrate processing apparatuses supplying other chemicals (photoresist, developer, etchant, etc.) onto substrate surfaces.

SUMMARY OF THE INVENTION

Accordingly, an object of the present invention is to provide a substrate processing apparatus which allows effective use of chemicals and a reduction in the operator's work load.

The present invention achieves the object above as follows.

The present invention is directed to a substrate processing apparatus for supplying a prescribed chemical onto a surface of a substrate, which includes:

- a chemical storage portion for storing the chemical at a proper temperature for storage;
- a chemical pressure-transferring portion for applying pressure to the chemical to cause the chemical to flow from the chemical storage portion;
- a chemical passage having a temperature controlling portion provided in its course for changing the temperature of the chemical from the proper temperature for storage to a proper temperature for use, and for guiding the chemical which is caused to flow by the chemical pressure-transferring portion; and
- a chemical dispensing unit for dispensing the chemical guided by the chemical passage onto the surface of the substrate.

As stated above, according to the present invention, a chemical is stored in advance in the chemical storage portion at a proper storage temperature. When the chemical is used, the temperature of the chemical is brought to a proper use temperature by the temperature controlling portion disposed in the course of the chemical passage. This enables the temperature change to be accomplished in a short time and increases the efficiency of the substrate processing. Furthermore, since the chemical does not deteriorate in the chemical storage portion, a large amount of chemical can be stored and therefore an operator does not have to exchange the chemical for each substrate processing. This increases the work efficiency of the operator. Furthermore, since only a required amount of chemical for substrate processing is subjected to the temperature transformation to the proper use temperature, there is no need to discard the remainder of the chemical.

In the invention, when the chemical storage portion includes,

- a chemical container for containing the chemical, and
- a chemical cooling portion having a circulating path in which thermostatically controlled cooling-water circulates to bring the temperature of the chemical to the proper temperature for storage, wherein the circulating path is disposed so that the thermostatically controlled cooling-water circulates around the chemical container, then the chemical is stored at the proper temperature for storage.

It is preferred that the chemical container is disposed in a higher position than the position where the chemical is dispensing from the chemical dispense unit. When the chemical container is disposed in this manner, gravity acts on the chemical sent out from the chemical pressure-transferring portion to allow the chemical to be guided to the dispensing position with less pressure.

The present invention, may further include a dew condensation preventing portion for preventing dew condensation inside the chemical storage portion by supplying inert gas into the chemical storage portion, as a result the chemical and water vapor in the air are less likely to cause a chemical reaction.

Furthermore, the present invention, may include a remaining quantity detecting portion for detecting the quantity of remainder of the chemical stored in the chemical storage portion, as a result, it is easy to determine when to exchange the chemical container.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
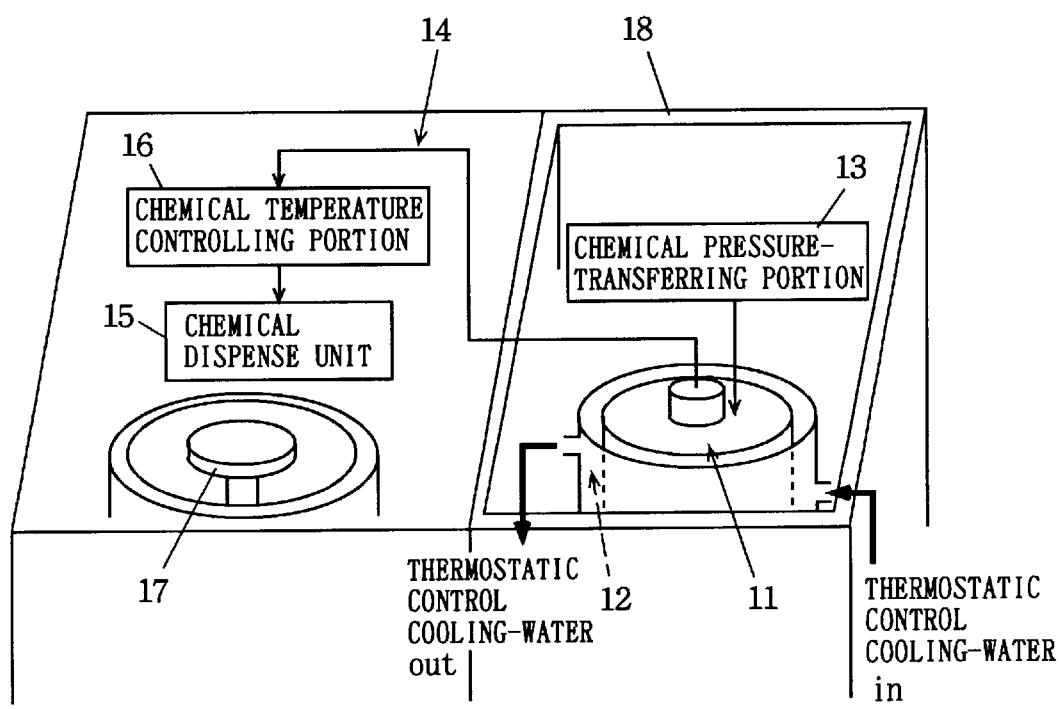
FIG. 2 is a block diagram showing the structure of a substrate processing apparatus according to a first embodiment of the present invention.

FIG. 2 is a block diagram showing the overall structure of a substrate processing apparatus according to a first embodiment of the present invention. In FIG. 2 the substrate processing apparatus includes a chemical container 11 (shown as dotted parts in FIG. 2, FIG. 3 and FIG. 4) for containing a chemical such as SOG, a chemical cooling unit 12 surrounding the chemical container 11 and in which thermostatically controlled cooling-water for keeping the chemical cool is circulated, a chemical pressure-transferring portion 13 for pressurizing the chemical in the chemical container 11 with inert gas such as nitrogen gas to send out the chemical from the chemical container 11, a chemical introducing pipe 14 for guiding the chemical sent out from the chemical container 11, a chemical dispensing unit 15 for dispensing the chemical guided by the chemical introducing pipe 14 onto the substrate surface, a chemical temperature controlling portion 16 provided in the course of the chemical introducing pipe 14 for regulating the temperature of the chemical to a proper temperature for use, and a wafer chuck 17 for holding the substrate by vacuum suction or the like in such a manner that it can rotate in a horizontal plane. Among these components, the chemical container 11 and the chemical cooling unit 12 are accommodated in a chemical cooling cabinet 18 in the form of a small case to improve the function of keeping the chemical cool. The chemical cooling cabinet 18 is installed in the substrate processing apparatus. As a result the chemical introducing pipe 14 can be shorter, as compared with a system in which the piping equipment is disposed between a refrigerator and the substrate processing apparatus (the SOG coater). This allows the chemical pressure-transferring portion 13 to pour the nitrogen gas with a lesser pressure. This inhibits disolution of the nitrogen gas in SOG, which allows the chemical dispensing unit 15 to dispense the SOG less contained the nitrogen gas onto the substrate surface. Thus a thin film with a uniform thickness can be formed on the substrate surface without bubbling of the nitrogen gas in the SOG.

Figure 1:
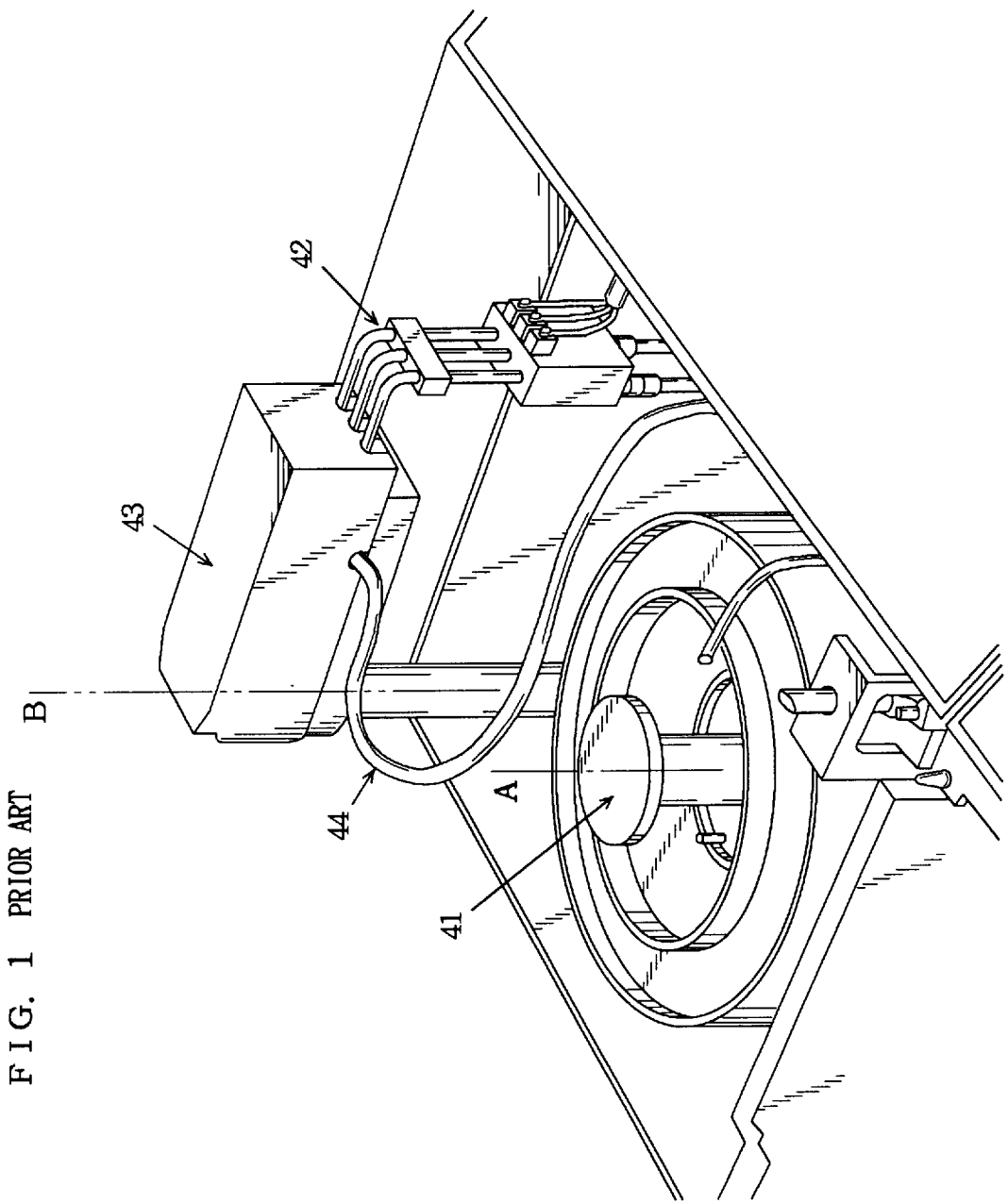
FIG. 1 is a perspective view showing the structure of a conventional substrate processing apparatus.

The chemical dispensing unit 15 includes a chemical dispensing nozzle for dispensing the chemical guided by the chemical introducing pipe 14 onto the substrate surface, and a nozzle arm for rotating the chemical dispensing nozzle in a plane parallel to the substrate to place it in a prescribed position above the substrate. In the figure, the components of the chemical dispensing unit 15 are shown in a simplified form to clarify the invention. Operations of these components are the same as those of the corresponding ones in FIG. 1 which are not described here.

Operation of the individual parts of the substrate processing apparatus having the aforementioned structure will be described in a case in which SOG is used as the chemical. The chemical container 11 containing SOG is stored in a refrigerator (not shown), for example. An operator takes out the chemical container 11 from the refrigerator and put the chemical container 11 into a prescribed position in the chemical cooling cabinet 18. When the chemical container 11 is installed in the chemical cooling unit 12, thermostatically controlled cooling-water set at about 5° C. flows in, circulates inside, and flows out. Accordingly, the SOG contained in the chemical container 11 is always kept cool at about 5° C.

When supplying SOG onto the substrate, the operator of the substrate processing apparatus operates a data input unit, not shown, to enter a command for performing 'chemical supply process' into the substrate processing apparatus. In response to this command, the chemical pressure-transferring portion 13 feeds inert gas, such as nitrogen gas, into the chemical container 11. Fed with the inert gas, the chemical container 11 sends out SOG into the chemical introducing pipe 14. The SOG is first guided by the chemical introducing pipe 14 to the chemical temperature controlling portion 16 provided on the way. The chemical temperature controlling portion 16 adjusts the temperature of the SOG to the proper temperature for use (around the room temperature; about 23° C.), as has been described earlier.

The structure of the chemical temperature controlling portion 16 will now be described. The chemical temperature controlling portion 16 includes a thermostatic passage (not shown) in which thermostatically controlled water having an appropriate temperature flows to increase the temperature of the SOG to about the room temperature. This thermostatic passage surrounds the chemical introducing pipe 14 in a prescribed area. The chemical temperature controlling portion 16 transforms the temperature of the low-temperature SOG guided by the chemical introducing pipe 14 with the thermostatically controlled water flowing in the thermostatic passage. This allows the SOG which has passed through the chemical temperature controlling portion 16 to have the proper temperature for use around the room temperature. The SOG is guided by the chemical introducing pipe 14 to the chemical dispensing unit 15 and dispensed from the aforementioned chemical dispensing nozzle. Thus the substrate is supplied with the SOG.

Figure 3:
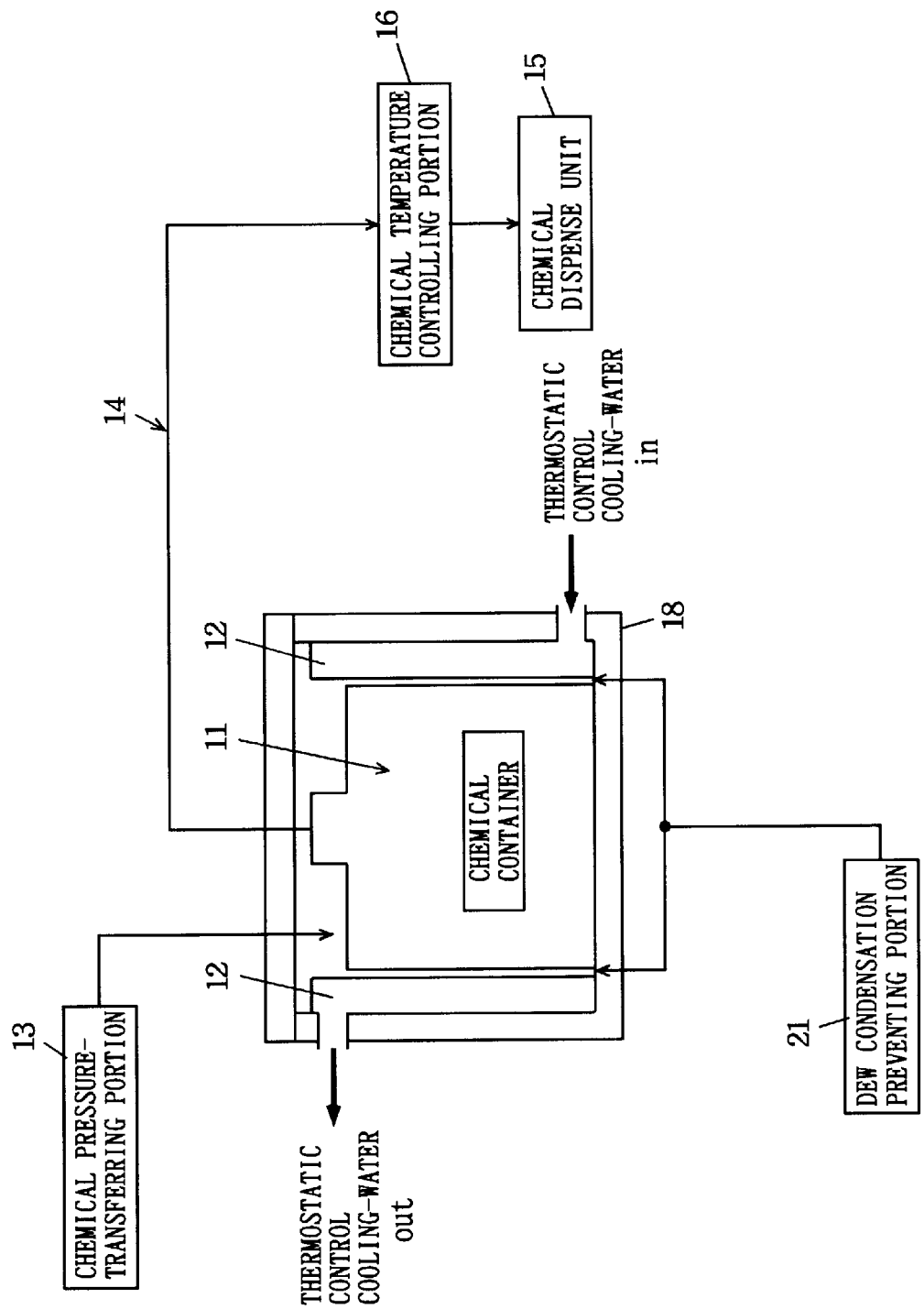
FIG. 3 is a block diagram showing the structure of a substrate processing apparatus according to a second embodiment of the present invention.

FIG. 3 is a block diagram showing the structure of a substrate processing apparatus according to a second embodiment of the present invention. In FIG. 3 the same structural elements as those in the substrate processing apparatus shown in FIG. 2 the shown with the same reference numerals and are therefore not described again. In FIG. 3, the substrate processing apparatus includes a dew condensation preventing portion 21 in addition to the components shown in FIG. 2. The temperature in the chemical cooling cabinet 18 is kept at about 5° C. by the structure described in the first embodiment. Hence, water vapor in the air condenses in the chemical cooling cabinet 18. The dew condensation preventing portion 21 pours a dry nitrogen gas having a dew point of about −35° C. into the chemical cooling cabinet 18 to prevent dew condensation in the chemical cooling cabinet 18. Operations of the individual parts for supplying the chemical such as SOG are the same as those in the substrate processing apparatus according to the first embodiment, and those are not described again.

Figure 4:
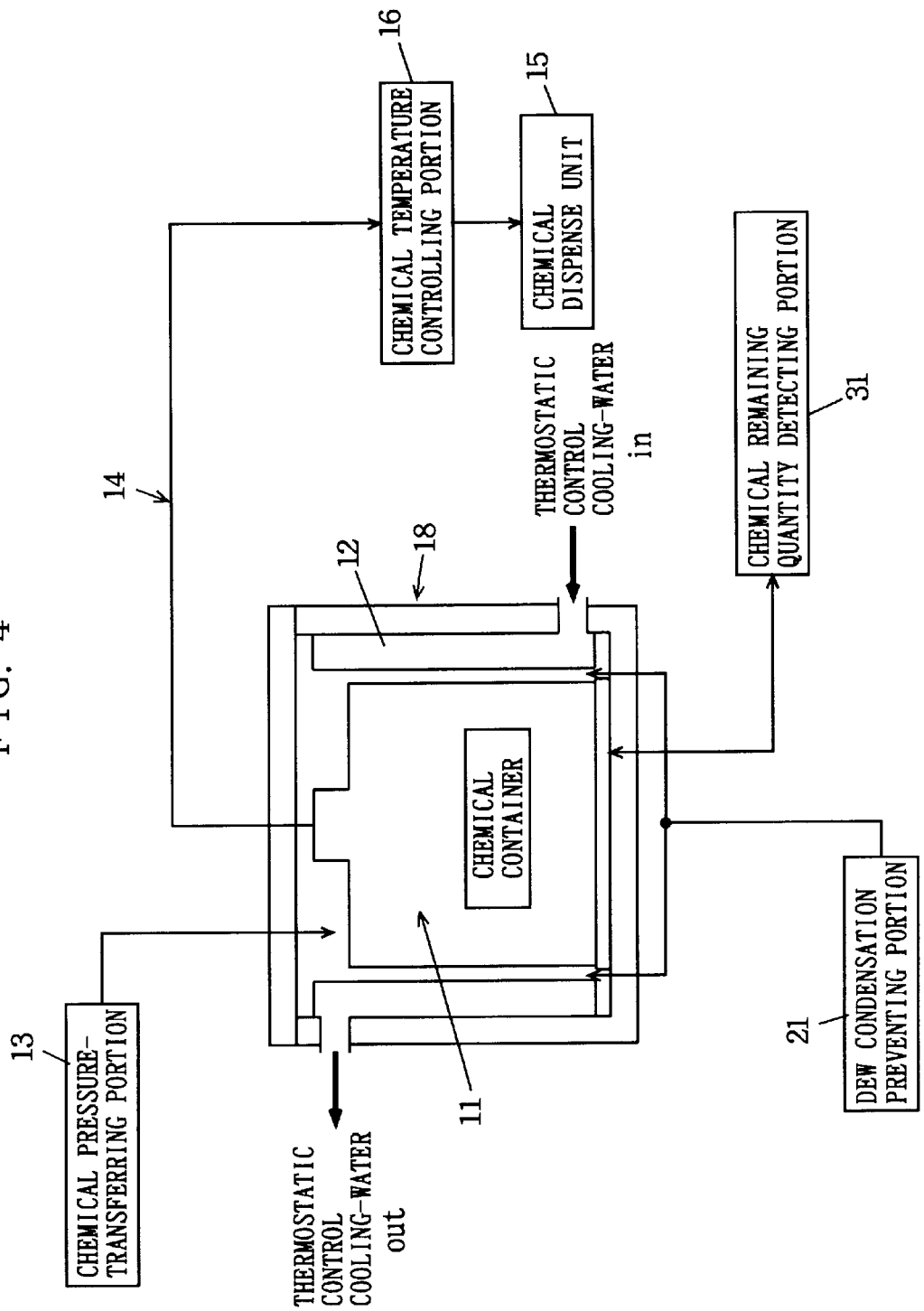
FIG. 4 is a block diagram showing the structure of a substrate processing apparatus according to a third embodiment of the present invention.

FIG. 4 is a block diagram showing the structure of a substrate processing apparatus according to a third embodiment of the present invention. In FIG. 4, the same structural elements as those of the substrate processing apparatus shown in FIG. 3 are shown with the same reference numerals and as therefore not described here again. In FIG. 4, the substrate processing apparatus includes a chemical remaining quantity detecting portion 31 in addition to the structural elements shown in FIG. 3. The chemical remaining quantity detecting portion 31 detects the weight of the chemical container 11, for example. When there is not much of the chemical left, its informs the operator by a display, not shown, for example. The operations of the individual components when supplying the chemical and the operation of the dew condensation preventing portion 21 are the same as those of the substrate processing apparatuses of the first or second embodiment, and those are therefore not described again.

In the substrate processing apparatuses according to the first to third embodiments, locating the chemical cooling cabinet 18 so that the position of the chemical container 11 is higher than the position of the chemical dispensing nozzle of the chemical dispensing unit 15 allows the chemical pressure-transferring portion 13 to further reduce the pressure applied to the chemical. As a result, disolution of the inert gas in the chemical is suppressed and the chemical dispensing unit 15 can dispense the chemical containing a reduced amount of inert gas onto the substrate surface.

Thus, when spreading the chemical on the substrate surface to form film, thin film having a uniform thickness can be formed on the substrate surface.

Although the aforementioned embodiments have been described only with SOG, it should go without saying that the substrate processing apparatuses described above can be used with other chemicals having the property that the proper temperature for storage and the proper temperature for use are different, like SOG.

While the invention has been described in detail, the foregoing description is in all aspects illustrative and not restrictive. It is understood that numerous other modifications and variations can be devised without departing from the scope of the invention.

We claim:

1. A treatment chemical supply apparatus for use in a substrate processing apparatus which treats a substrate by applying a treatment chemical to the surface of the substrate at a treating temperature required for the proper treatment of said substrate by said treatment chemical, said treatment chemical supply apparatus comprising:

a storage container for storing said treatment chemical, said storage container located in a cooling cabinet and having a capacity for storing a sufficient quantity of treatment chemical to process a plurality of said substrates;

a cooling unit which maintains said treatment chemical stored in said storage container at a predetermined storage temperature which is both below said treating temperature and below room temperature, said cooling unit also cooling said cooling cabinet;

a treatment chemical transfer unit which transfers a predetermined quantity of said treatment chemical from said storage container to said surface of said substrate, said treatment chemical transfer unit including a heating unit which heats said transferred quantity of treatment chemical to said treating temperature before said transferred treatment chemical is applied to said surface of said substrate; and a dew preventing unit which prevents the formation of dew in said cooling cabinet.

2. The treatment chemical supply apparatus of claim 1, wherein said treatment chemical is spin on glass.

3. The treatment chemical supply apparatus of claim 1, wherein said treatment chemical transfer unit includes a supply pipe extending from said storage container to a nozzle for supplying said treatment chemical to said surface of said substrate, and said heating unit heats said transferred quantity of treatment chemical as it passes through said supply pipe.

4. The treatment chemical supply apparatus of claim 1, wherein said treatment chemical transfer unit further includes a gas supply source which supplies pressurized gas to said storage container to cause said treatment chemical transfer unit to transfer said predetermined quantity of said treatment chemical to said surface of said substrate.

5. The treatment chemical supply apparatus of claim 1, wherein said cooling unit circulates cooling medium in the thermal contact with said storage container to cool said treatment chemical stored therein.

6. The treatment chemical supply apparatus of claim 5, wherein said cooling medium is circulated around the periphery of said storage container.

7. The treatment chemical supply apparatus of claim 5, wherein said cooling medium is thermostatically controlled to maintain said treatment chemical at said predetermined storage temperature.

8. The treatment chemical supply apparatus of claim 1, wherein said storage container is in the form of a cylinder and said cooling unit circulates a cooling medium around the periphery of said cylinder.

9. The treatment chemical supply apparatus of claim 1, wherein said cooling unit maintains said treatment chemical in said storage container at a temperature of about 5 degrees centigrade.

10. The treatment chemical supply apparatus of claim 9, wherein said heating unit heats the temperature of said transferred quantity of treatment chemical to about 23 degrees centigrade.

11. The treatment chemical supply apparatus of claim 1, wherein said heating unit heats the temperature of said transferred quantity of treatment chemical to a sufficiently high temperature that said treatment chemical is supplied to said surface of said substrate at a temperature of about 23 degrees centigrade.

12. The treatment chemical supply apparatus of claim 1, wherein said treatment chemical transfer unit further includes a treatment chemical dispensing unit which dispenses said transferred treatment chemical onto said surface of said substrate via a dispensing tip of a nozzle.

13. The treatment chemical supply apparatus of claim 12, wherein said storage container is located above said dispensing tip of said treatment chemical dispensing unit.

14. The treatment chemical supply apparatus of claim 1, wherein said dew preventing unit supplies a gas having a dew point which is lower than the dew point of air to said cooling cabinet.

15. The treatment chemical supply apparatus of claim 14, wherein said dew point of said gas is about −35 degrees centigrade.

16. The treatment chemical supply apparatus of claim 14, wherein said gas is dry nitrogen gas.

17. The treatment chemical supply apparatus of claim 14, wherein said gas is supplied to an area surrounding said storage container.

18. The treatment chemical supply apparatus of claim 17, wherein said gas enters said cooling cabinet in an area adjacent the bottom periphery of said storage container.

19. The treatment chemical supply apparatus of claim 14, wherein said cooling unit surrounds said storage container and said gas is circulated in a space intermediate said cooling unit and said storage container.

20. The treatment chemical supply apparatus of claim 14, wherein said cooling unit circulates a cooling medium through a heat exchanger which surrounds said storage container and said gas is circulated in a space intermediate said heat exchanger and said storage container.

21. A treatment chemical supplying apparatus for use in a substrate processing apparatus which treats a substrate by applying a treatment chemical to the surface of the substrate at a treating temperature required for the proper treatment of said substrate by said treatment chemical, said treatment chemical supplying apparatus comprising:

a storage container for storing said treatment chemical, said storage container having a capacity for storing a sufficient quantity of treatment chemical to process a plurality of said substrates;

a cooling unit which maintains said treatment chemicals stored in said storage container at a predetermined storage temperature which is both below said treatment temperature and below room temperature;

a treatment chemical transfer unit which transfers a predetermined quantity of said treatment chemical from said storage container to said surface of said substrate, said treatment chemical transfer unit including a heating unit which heats said transferred quantity of treatment chemical to said treating temperature before said transferred treatment chemical is applied to said surface of said substrate; and a detection unit which detects the quantity of said treatment chemical in said storage container by weighing said storage container.

22. The treatment chemical supply apparatus of claim 21, wherein said detection unit provides an indication to the operator of said substrate processing apparatus that the quantity of treatment chemical in said storage container is less than a predetermined value.

23. The treatment chemical supply apparatus of claim 22, wherein said predetermined value is greater than zero.

24. The treatment chemical supply apparatus of claim 21, wherein said treatment chemical spins on glass.

25. The treatment chemical supply apparatus of claim 21, further including a dew preventing unit which prevents the formation of dew in a cooling cabinet housing said cooling unit.

26. The treatment chemical supply apparatus of claim 21, wherein said cooling unit maintains said treatment chemical in said storage container at a temperature of about 5 degrees centigrade.

27. The treatment chemical supply apparatus of claim 21, wherein said heating unit heats the temperature of said transferred quantity of treatment chemical to a sufficiently high temperature that said treatment chemical is supplied to said surface of said substrate at a temperature about 23 degrees centigrade.

* * * * *